(12) United States Patent
Lim et al.

(10) Patent No.: US 9,478,623 B2
(45) Date of Patent: Oct. 25, 2016

(54) METAL GATE STRUCTURE

(71) Applicant: Taiwan Semiconductor Manufacturing Company, Ltd., Hsin-Chu (TW)

(72) Inventors: Peng-Soon Lim, Kluang (MY); Tsai-Jung Ho, Xihu Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/497,114

(22) Filed: Sep. 25, 2014

(65) Prior Publication Data

US 2015/0008491 A1    Jan. 8, 2015

Related U.S. Application Data

(63) Continuation-in-part of application No. 13/214,996, filed on Aug. 22, 2011, now Pat. No. 9,048,334.

(51) Int. Cl.
| | |
|---|---|
| *H01L 29/49* | (2006.01) |
| *H01L 29/423* | (2006.01) |
| *H01L 21/28* | (2006.01) |
| *H01L 21/8234* | (2006.01) |
| *H01L 29/51* | (2006.01) |

(52) U.S. Cl.
CPC ... *H01L 29/42368* (2013.01); *H01L 21/28088* (2013.01); *H01L 21/28114* (2013.01); *H01L 21/823456* (2013.01); *H01L 29/42376* (2013.01); *H01L 29/4966* (2013.01); *H01L 29/513* (2013.01); *H01L 29/517* (2013.01)

(58) Field of Classification Search
CPC ....... H01L 27/00; H01L 23/00; H01L 23/48; H01L 29/423; H01L 29/4236; H01L 27/088; H01L 29/49; H01L 29/4966; H01L 29/42368
USPC ....... 257/334, 288, 774, 775, 665, 734, 741, 257/748

See application file for complete search history.

(56) References Cited

U.S. PATENT DOCUMENTS

| | | |
|---|---|---|
| 5,960,270 A | 9/1999 | Misra et al. |
| 6,492,267 B1 | 12/2002 | Yin et al. |
| 2006/0065939 A1 | 3/2006 | Doczy et al. |
| 2006/0289929 A1 | 12/2006 | Andrews |
| 2010/0124818 A1 | 5/2010 | Lee et al. |
| 2011/0195570 A1* | 8/2011 | Lin ................. C23C 14/022 438/652 |
| 2012/0049247 A1* | 3/2012 | Lee et al. ................. 257/288 |
| 2013/0049109 A1 | 2/2013 | Lim et al. |

* cited by examiner

*Primary Examiner* — Chuong A Luu
(74) *Attorney, Agent, or Firm* — Slater Matsil, LLP (57) ABSTRACT

A device comprises a metal gate structure in a trench and over a substrate, wherein the gate structure comprises a first metal sidewall in the trench, wherein the first metal sidewall becomes progressively thinner towards an upper portion of the first metal sidewall, a second metal sidewall in the trench, wherein the second metal sidewall becomes progressively thinner towards an upper portion of the second metal sidewall and a metal bottom layer on a bottom of the trench and between the first metal sidewall and the second metal sidewall.

20 Claims, 10 Drawing Sheets

METAL GATE STRUCTURE

This application is a continuation-in-part of U.S. patent application Ser. No. 13/214,996, filed Aug. 22, 2011 now U.S. Pat. No. 9,048,334, and entitled "Metal Gate Structure," which application is hereby incorporated herein by reference.

BACKGROUND

Since the invention of the integrated circuit, the semiconductor industry has experienced rapid growth due to improvements in the integration density of a variety of electronic components (e.g., transistors, diodes, resistors, capacitors, etc.). This improvement in integration density has come from shrinking the semiconductor process node (e.g., shrink the process node towards the sub-20 nm node). As the demand for miniaturization continues, the further shrinking of the process node may increase the complexity of fabricating integrated circuits.

An integrated circuit may comprise a variety of metal oxide semiconductor (MOS) devices. Each MOS device may comprise a substrate layer. A dielectric layer such as a layer of silicon dioxide may be formed on top of the substrate layer. Furthermore, a conductive layer such as a layer of metal or polycrystalline silicon may be deposited on top of the dielectric layer to form a gate structure of the MOS device. In addition, the MOS device may comprise a drain region and a source region. Both regions are highly doped with the same type doping, such as a p-type doping or an n-type doping. Both regions are further connected to two metal contacts to form a drain terminal and a source terminal respectively.

The gate of a MOS device can be formed of either polycrystalline silicon or metal. As semiconductor technologies evolve, MOS devices having a metal gate structure have emerged as an effective solution to further improve the performance of MOS devices. For example, the metal gate structure can reduce the resistance of a gate terminal so as to improve the propagation delay when a gate signal passes through the gate terminal. A variety of metal materials such as tantalum nitride, metal carbide, tantalum, titanium and/or the like can be used to form the gate structure of MOS devices.

Various technologies can be employed to deposit metal materials to form a metal gate structure. Metal materials can be deposited on top of a dielectric layer through a chemical vapor deposition (CVD) process. Alternatively, a metal layer can be formed by a physical vapor deposition (PVD) process. During a PVD process, metal materials are sputtered or vaporized and deposited on the surface of a wafer. The PVD process mainly employs physical processes such as vacuum evaporation or plasma sputter bombardment.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The present invention will be described with respect to preferred embodiments in a specific context, a metal gate structure for a metal oxide semiconductor (MOS) device. The invention may also be applied, however, to a variety of semiconductor devices.

Figure 1:
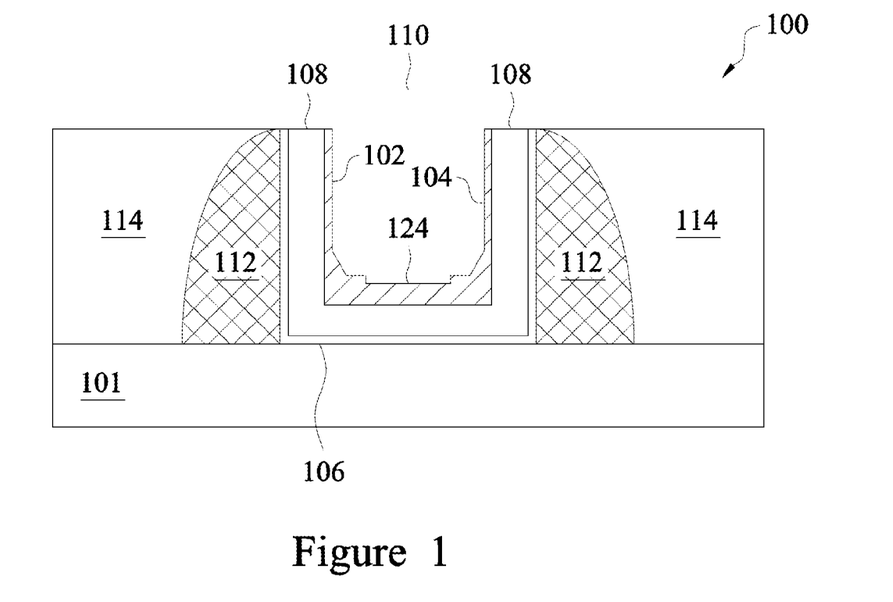
FIG. 1 illustrates a cross sectional view of a metal gate structure in accordance with an embodiment.

Referring initially to FIG. 1, a cross sectional view of a metal gate structure is illustrated in accordance with an embodiment. The metal gate structure 100 comprises a trench 110. The trench 110 has a first metal sidewall 102, a second metal sidewall 104 and a metal bottom layer 124. As shown in FIG. 1, the first metal sidewall 102, the second metal sidewall 104 and the metal bottom layer 124 may form a metal interior layer of the trench 110. The metal interior layer may be formed of titanium nitride, tantalum nitride, tungsten nitride, titanium, tantalum and/or combinations thereof. The metal interior layer may be formed by employing a physical vapor deposition (PVD) process. Alternatively, the metal interior layer may be formed by using a chemical vapor deposition (CVD) process or the like. Both the PVD process and the CVD process are known in the art, and hence are not discussed in further detail. In accordance with an embodiment, the first sidewall 102 and the second sidewall 104 may have a thickness less than 10 angstrom. The detailed fabrication procedures of forming the sidewalls 102, 104 will be discussed below with respect to FIGS. 2-5.

The metal interior layer is formed on a dielectric layer 108. The dielectric layer 108 may be formed by employing CVD or PVD processes. Alternatively, the dielectric layer 108 may be formed using an atomic layer deposition (ALD) process. The dielectric layer 108 may be formed of high-k dielectric materials. In one embodiment, the high-k dielectric material includes HfO2. In another embodiment, the high-k dielectric material includes Al2O3. Alternatively, the high-k dielectric material layer includes metal nitrides, metal silicates and/or combinations thereof. In accordance with an embodiment, the dielectric layer 108 may have a thickness ranging from about 10 angstrom to about 35 angstrom.

The gate structure 100 may further comprise a barrier layer 106 formed between a substrate 101 and the dielectric layer 108. The barrier layer 106 may be formed by using suitable thermal treatment techniques, wet treatment techniques or deposition techniques such as PVD, CVD, ALD or the like. The barrier layer 106 may be formed of silicon oxide, silicon nitride, silicate based and the like. In accordance with an embodiment, the barrier layer 106 may have a thickness less that 15 angstrom.

The gate structure 100 may further comprise a plurality of gate spacers 112. The gate spacers 112 are used to isolate the metal gate structure from the adjacent semiconductor structures as well as for aligning subsequently formed source and drain regions. In accordance with an embodiment, the gate spacers 112 may be formed of silicon nitride. Alternatively, the gate spacer 112 may be formed of nitride or oxide based dielectric materials. The gate structure 100 shown in FIG. 1 further comprises an inter-layer dielectric (ILD) layer 114. The ILD layer 114 may be formed, for example, of a low-K dielectric material, such as silicon oxide, phosphosilicate glass (PSG), borophosphosilicate glass (BPSG), fluorinated silicate glass (FSG), $SiO_xC_y$, Spin-On-Glass, Spin-On-Polymers, silicon carbon material, compounds thereof, composites thereof, combinations thereof or the like, by any suitable method known in the art, such as spin coating, CVD and the like.

Figure 2:
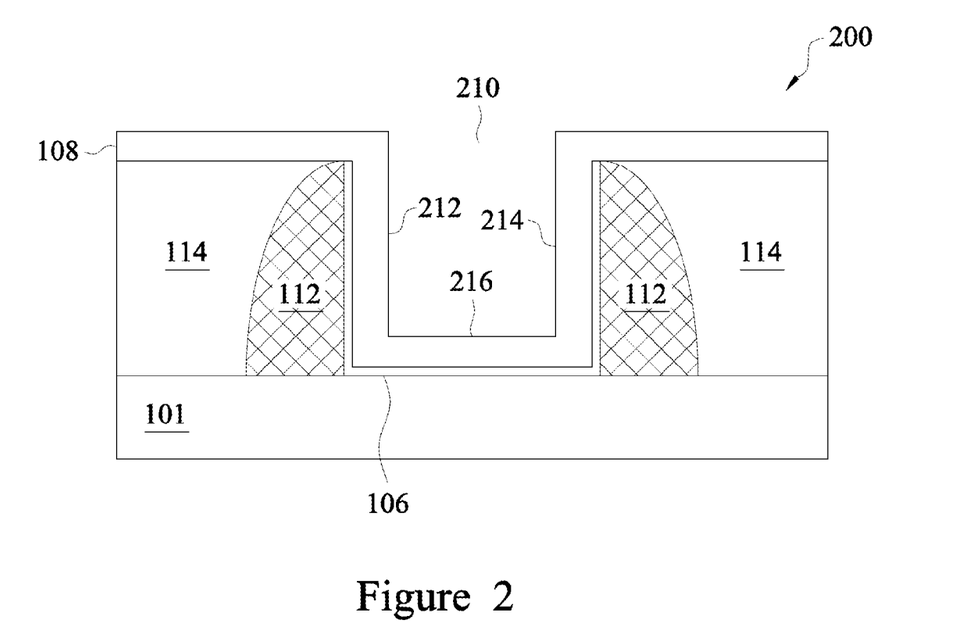
FIGS. 2-5 are cross sectional views of intermediate stages in the making of a metal gate structure in accordance with an embodiment.

FIGS. 2-5 are cross sectional views of intermediate stages in the making of a metal gate structure in accordance with an embodiment. As shown in FIG. 2, the gate structure 200 is similar to the gate structure 100 shown in FIG. 1 except that the interior metal layer is not formed on the dielectric layer 108 yet. As shown in FIG. 2, the dielectric layer 108 may be further divided into several portions depending on the location of each portion. The dielectric layer 108 may comprise a first dielectric sidewall 212, a second dielectric sidewall 214 and a dielectric bottom layer 216. In accordance with an embodiment, the first dielectric sidewall 212, the second dielectric sidewall 214 and the dielectric bottom layer 216 may be of the same thickness.

FIG. 2 shows that the metal layer is not coated on the dielectric layer 108. In accordance with an embodiment, the channel of a MOS device having the metal structure 200 may have a length of approximately 30 nm. Such a length makes the MOS device with the metal gate structure 200 fall into a MOS device category commonly referred to as short channel MOS devices. It should be noted that FIGS. 2-5 shows the advantageous features of making a thin metal layer, especially a thin sidewall of a metal gate structure for a short channel MOS device. The metal sidewall difference between a short channel MOS device and a long channel MOS device will be described in further detail with respect to FIG. 6.

Figure 3:
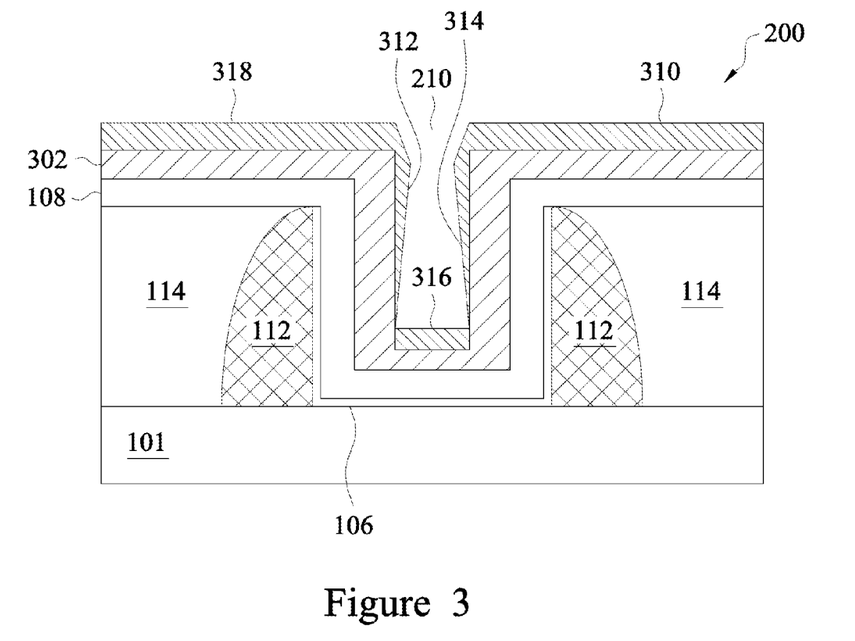

FIG. 3 illustrates a process of depositing a metal layer and a protection layer. A metal layer 302 is formed on the dielectric layer 108 using suitable deposition techniques such as ALD, CVD, PVD and the like. The above deposition techniques are well known in the art, and hence are not discussed herein. In accordance with an embodiment, the metal layer 302 is formed of titanium nitride, tantalum nitride, tungsten nitride, titanium, tantalum and/or combinations thereof. In accordance with an embodiment, the metal layer 302 may have a thickness of 20 angstrom.

Subsequently, a protection layer 310 is formed on the metal layer 302 using a PVD process. The protection layer 310 is formed of dielectric materials such as silicon, silicon dioxide or the like. Depending on the location, the protection layer 310 may be further divided into four portions, namely a top protection layer 318, a first sidewall protection layer 312, a second sidewall protection layer 314 and a bottom protection layer 316. In accordance with an embodiment, the bottom protection layer 316 may be of a thickness more than 15 angstrom. In contrast, the lower portions of both the first sidewall protection layer 312 and the second sidewall protection layer 314 may be of a thickness less than 20 angstrom.

In addition, The PVD process can create an uneven protection layer. As shown in FIG. 3, both the first sidewall protection layer 312 and the second sidewall protection layer 314 may be of an uneven thickness. More particularly, the upper portion of the sidewall protection layer (e.g., 312) is thicker than the lower portion of the sidewall protection layer (e.g., 312). It should be noted that one advantageous feature of using the PVD process is an uneven sidewall protection layer can be created. Moreover, by employing an etch-back process, the thin metal sidewall shown in FIG. 1 can be obtained. In addition, another advantageous feature of having an uneven protection layer on the metal layer 302 is that the thickness of the sidewalls of the metal gate structure 200 can be controlled by adjusting the thickness of the first sidewall protection layer 312 and the second sidewall protection layer 314. It should be noted that while FIG. 3 shows both the first sidewall protection layer 312 and the second sidewall protection layer 314 may be of the same thickness, a person skilled in the art will recognize that it is within the scope and spirit of various embodiments for both protection layers to comprise different thicknesses. Alternatively, the thickness of each sidewall could also be adjusted by using different etch-back processes.

Figure 4:
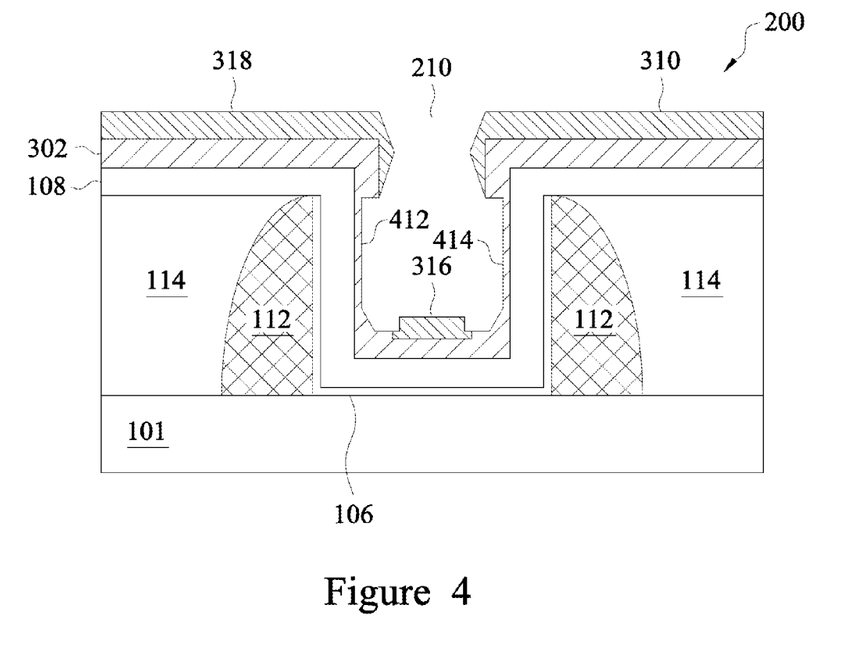

FIG. 4 illustrates an etch-back process in accordance with an embodiment. A suitable etching process such as wet-etching or dry-etching may be applied to the metal gate structure 200. The detailed operations of either the dry etching process or the wet etching process are well known, and hence are not discussed herein to avoid repetition. In accordance with an embodiment, an isotropic etching process is employed to perform the etch-back. The protection layer 310 may be etched back during the isotropic etching process. Because each portion of the protection layer 310 may have a different thickness and the isotropic etching etches equally in all directions, the thin portion such as the first sidewall protection layer 312 and the second sidewall protection layer 314 may be fully removed. As a result, both metal sidewalls are etched back subsequently, so that two thin metal sidewalls are formed. As shown in FIG. 4, the metal gate structure 200 may have thinner metal sidewalls in comparison with those shown in FIG. 3. In accordance with an embodiment, a first metal sidewall 412 and a second metal sidewall 414 may be of a thickness of approximately 10 angstrom.

FIG. 4 further shows the bottom protection layer 316 remains with a significant thickness after the etch-back process. Referring back to FIG. 3, the lower portions of the first sidewall protection layer 312 and the second sidewall protection layer 314 is thinner than the upper portions of the first sidewall protection layer 312 and the second sidewall protection layer 314. Therefore, the etchant may etch the lower portions first. The bottom protection layer 316 helps to prevent the etching process from removing the bottom metal layer. It should be noted that while FIG. 4 shows the remaining portion of the bottom protection layer 316 is drawn with sharp lines, a person having ordinary skill in the art will recognize that the isotopic etching process may produce a remaining portion with various rounded edges.

Figure 5:
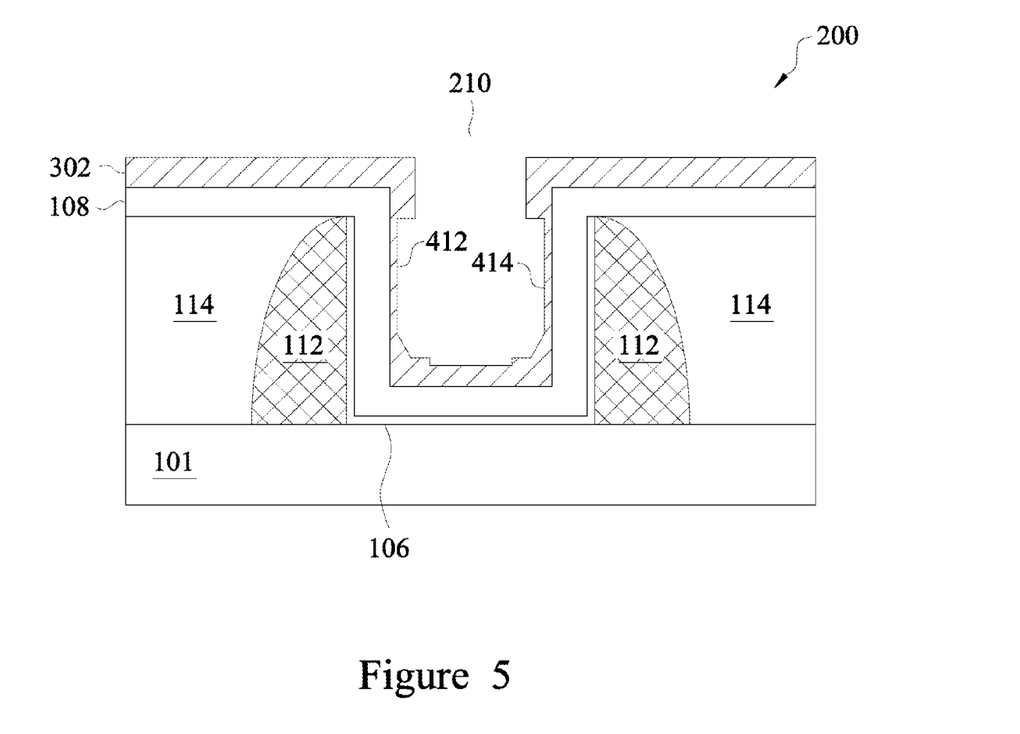

FIG. 5 illustrates a metal gate structure after removing the remaining bottom protection layer. The remaining bottom protection layer may be removed by a dry etching or a wet etching process. After removing the bottom protection layer, the metal gate structure 200 comprises the same metal gate structure as that shown in FIG. 1. An advantageous feature of having a remaining bottom protection layer is that a thin sidewall can be achieved during an etch-back process. Furthermore, the thin metal sidewalls (e.g., the first metal sidewall 412) allow extra space for a subsequent metal-fill process to fill the trench 210 of the metal gate structure 200.

Figure 6:
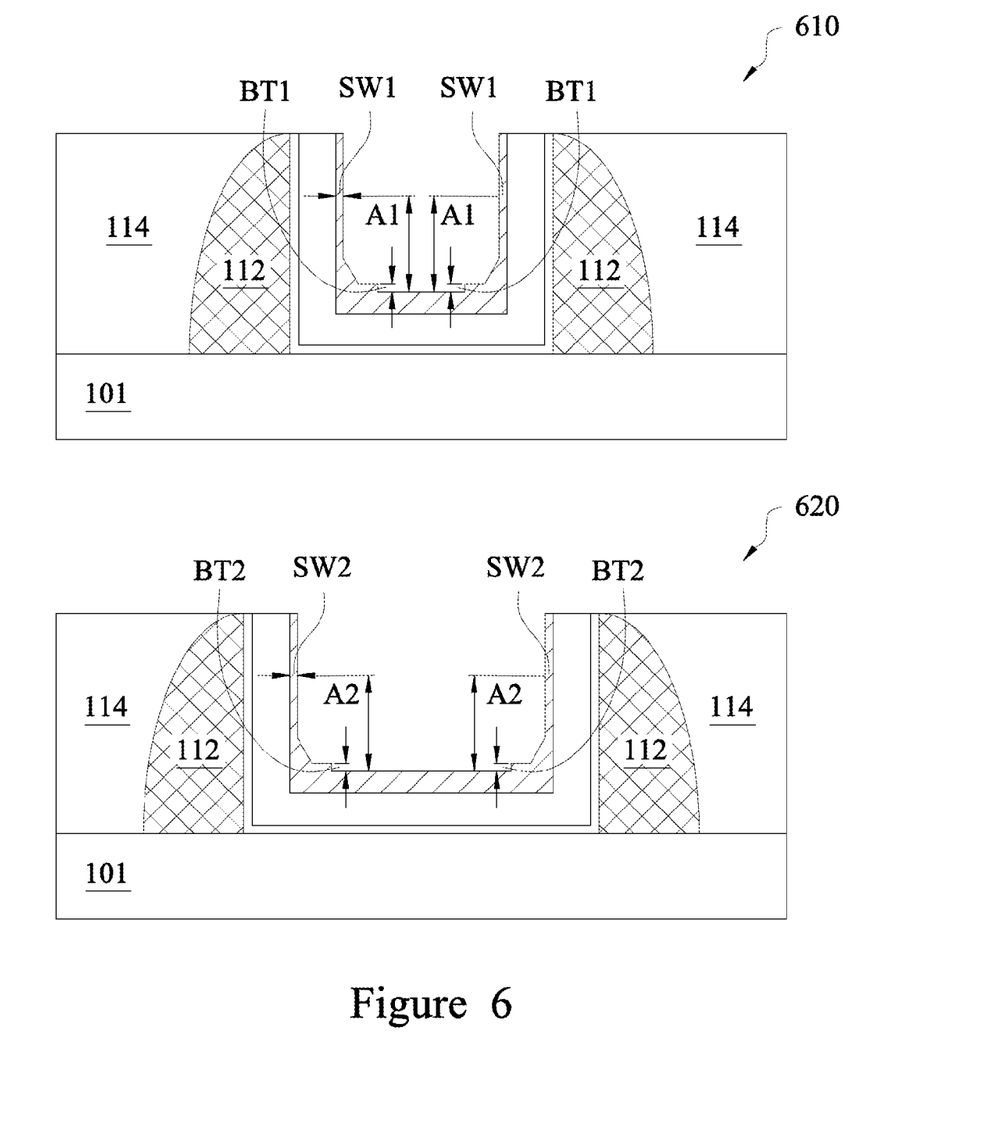
FIG. 6 illustrates the metal gate difference between a short channel MOS device and a long channel MOS device by employing the process described with respect to FIGS. 2-5.

FIG. 6 illustrates the metal gate difference between a short channel MOS device and a long channel MOS device by employing the process described with respect to FIGS. 2-5. As shown in FIG. 6, a short channel MOS device 610 and a long channel MOS device 620 may be of the same structure except that the channel length of the short channel MOS device 610 is less than that of the long channel MOS device 620. In accordance with an embodiment, the channel length of the short channel MOS device 610 is less than 30 nm. In contrast, the channel length of the long channel MOS device 620 is more than 250 nm.

Despite that the same fabrication process may be employed, some physical parameters of metal layers may be different for short channel MOS devices and long channel MOS devices. For example, by employing a PVD process, the thickness of the protection layer of the long channel MOS device 620 is thicker than that of the short channel MOS device. As a result, after an etch-back process is performed, less metal materials are left on the sidewall of the short channel MOS device 610 in comparison with that of the long channel MOS device 620. As shown in FIG. 6, the metal sidewall thicknesses of the short channel MOS device 610 and the long channel MOS device 620 are defined as SW1 and SW2 respectively. As shown in FIG. 6, SW1 is measured at a point A1 from the bottom of the metal layer. Similarly, SW2 is measured at a point A2 from the bottom of the metal layer. In accordance with an embodiment, A1 and A2 are approximately 50 angstrom. By employing the etch-back process illustrated in FIG. 4, SW2 is bigger than SW1. In accordance with an embodiment, SW1 is of a thickness less than 10 angstrom. In contrast, SW2 is of a thickness more than 15 angstrom. On the other hand, the plateau regions formed by removing the remaining bottom protection layer may be of a height BT1 and BT2 respectively. In accordance with an embodiment, BT1 is of a height ranging from about 5 angstrom to about 35 angstrom. In contrast, BT2 is of a height ranging from about 15 angstrom to about 40 angstrom. It should be noted that when a same fabrication process is employed, BT1 is less than BT2.

Figure 7:
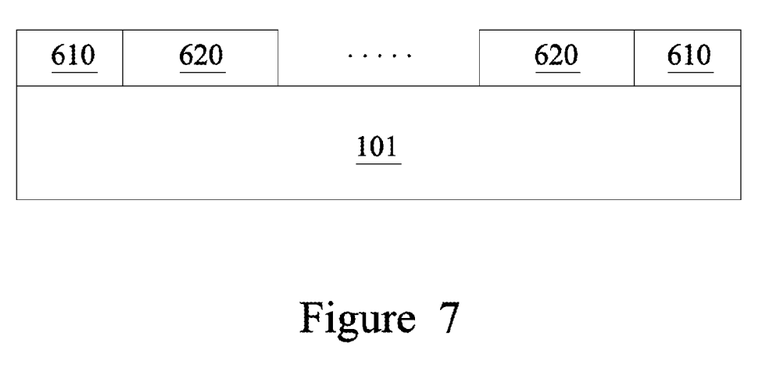
FIG. 7 illustrates a cross sectional view of a variety of MOS devices fabricated on a substrate in accordance with an embodiment.

FIG. 7 illustrates a cross sectional view of a variety of MOS devices fabricated on a substrate in accordance with an embodiment. On a substrate 101, there may be various MOS devices. The MOS devices may include a short channel MOS device 610 and long channel MOS device 620. As described above with respect to FIG. 6, after an etch-back process, the short channel MOS device 610 may have a thinner metal sidewall in comparison with that of the long channel MOS device 620, which is fabricated on the same substrate 101.

Figure 8:
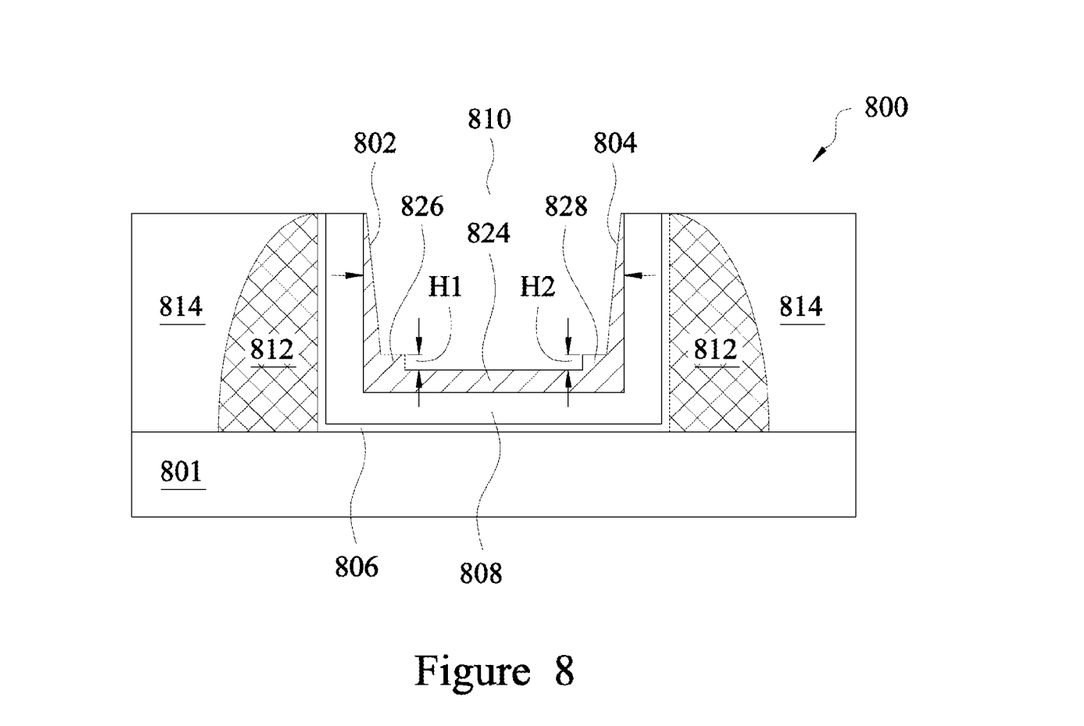
FIG. 8 illustrates a cross sectional view of another metal gate structure in accordance with various embodiments of the present disclosure.

FIG. 8 illustrates a cross sectional view of another metal gate structure in accordance with various embodiments of the present disclosure. The metal gate structure 800 comprises a trench 810 formed in a dielectric layer 814 and over a substrate 801. The trench 810 comprises a first metal sidewall 802, a second metal sidewall 804, a first corner step region 826, a second corner step region 828 and a metal bottom layer 824.

As shown in FIG. 8, the first metal sidewall 802, the second metal sidewall 804, the first corner step region 826, the second corner step region 828 and the metal bottom layer 824 may form a metal interior layer of the trench 810. The first corner step region 826 is between the first metal sidewall 802 and the metal bottom layer 824. The first corner step region 826 is of a height of H1 as shown in FIG. 8. Likewise, the second corner step region 828 is between the second metal sidewall 804 and the metal bottom layer 824. The second corner step region 828 is of a height of H2 as shown in FIG. 8. In some embodiments, H1 is in a range from about 5 angstroms to about 35 angstroms. Likewise, H2 is in a range from about 5 angstroms to about 35 angstroms.

As shown in FIG. 8, the thickness of the first metal sidewall 802 is not uniform. In particular, an upper portion of the first metal sidewall 802 is thinner than a lower portion of the first metal sidewall 802. In other words, the first metal sidewall 802 becomes progressively thinner towards the upper portion of the first metal sidewall 802. Likewise, an upper portion of the second metal sidewall 804 is thinner than a lower portion of the second metal sidewall 804. The second metal sidewall 804 becomes progressively thinner towards the upper portion of the second metal sidewall 804 as shown in FIG. 8. The detailed formation process of the first metal sidewall 802 and the second metal sidewall 804 will be described below with respect to FIGS. 9-13.

The metal interior layer may be formed of suitable metal materials such as titanium nitride, tantalum nitride, tungsten nitride, titanium, tantalum, any combinations thereof and/or the like. The metal interior layer may be formed by employing a physical vapor deposition (PVD) process. Alternatively, the metal interior layer may be formed by using a chemical vapor deposition (CVD) process or the like. Both the PVD process and the CVD process are known in the art, and hence are not discussed in further detail.

The metal interior layer is formed on a dielectric layer 808. The dielectric layer 808 may be formed by employing CVD or PVD processes. Alternatively, the dielectric layer 808 may be formed using an atomic layer deposition (ALD) process. The dielectric layer 808 may be formed of high-k dielectric materials. In some embodiments, the high-k dielectric materials may include HfO2. In alternative embodiments, the high-k dielectric materials may include Al2O3. Alternatively, the high-k dielectric material layer includes metal nitrides, metal silicates and/or combinations thereof. In accordance with some embodiments, the dielectric layer 808 may have a thickness ranging from about 10 angstroms to about 35 angstroms.

The metal gate structure 800 may further comprise a barrier layer 806 formed between the substrate 801 and the dielectric layer 808. The barrier layer 806 may be formed by using suitable thermal treatment techniques, wet treatment techniques or deposition techniques such as PVD, CVD, ALD or the like. The barrier layer 806 may be formed of silicon oxide, silicon nitride, silicate based and the like. In accordance with some embodiments, the barrier layer 106 may have a thickness less than 15 angstroms.

The metal gate structure 800 may further comprise a plurality of gate spacers 812. The gate spacers 812 are used to isolate the metal gate structure from the adjacent semiconductor structures as well as for aligning subsequently formed source and drain regions. In accordance with some embodiments, the gate spacers 812 may be formed of silicon nitride. Alternatively, the gate spacer 812 may be formed of nitride or oxide based dielectric materials.

The metal gate structure 800 shown in FIG. 8 further comprises a dielectric layer 814. The dielectric layer 814 may be formed, for example, of a low-K dielectric material, such as silicon oxide, phosphosilicate glass (PSG), borophosphosilicate glass (BPSG), fluorinated silicate glass (FSG), $SiO_xC_y$, Spin-On-Glass, Spin-On-Polymers, silicon carbon material, compounds thereof, composites thereof, combinations thereof or the like, by any suitable method known in the art, such as spin coating, CVD and the like.

FIGS. 9-13 are cross sectional views of intermediate stages in the making of a metal gate structure shown in FIG. 8 in accordance with various embodiments of the present disclosure. The channel of a MOS device may be divided into two types. When a channel of a MOS device is greater than 250 nm, the MOS device is a long channel MOS device. Otherwise, the MOS device is a short channel MOS device. The fabrication process of the metal gate structure of a long channel MOS device is similar to that of a short channel MOS device. For simplicity, only the fabrication process of a long channel MOS device is illustrated below with respect to FIGS. 9-13.

Figure 9:
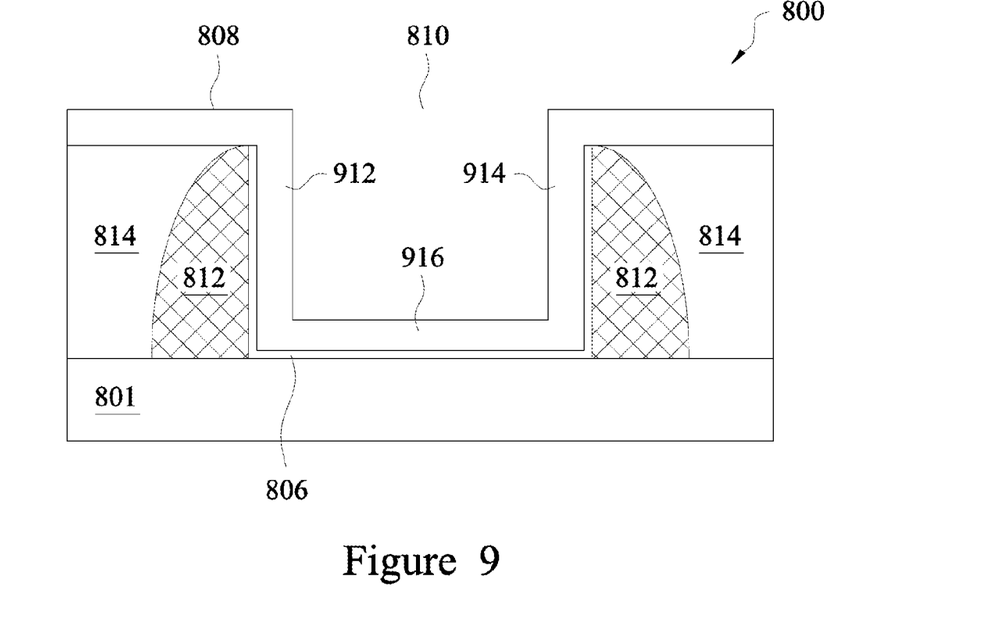
FIGS. 9-13 are cross sectional views of intermediate stages in the making of a metal gate structure shown in FIG. 8 in accordance with various embodiments of the present disclosure.

FIG. 9 illustrates a cross sectional view of the gate structure shown in FIG. 8 before the interior metal layer is formed in the trench in accordance with various embodiments of the present disclosure. As shown in FIG. 9, the dielectric layer 808 is formed on the sidewalls and bottom of the trench 810. As shown in FIG. 9, the dielectric layer 808 may be further divided into several portions depending on the location of each portion. The dielectric layer 808 may comprise a first dielectric sidewall 912, a second dielectric sidewall 914 and a dielectric bottom layer 916. In accordance with some embodiments, the first dielectric sidewall 912, the second dielectric sidewall 914 and the dielectric bottom layer 916 may be of the same thickness.

Figure 10:
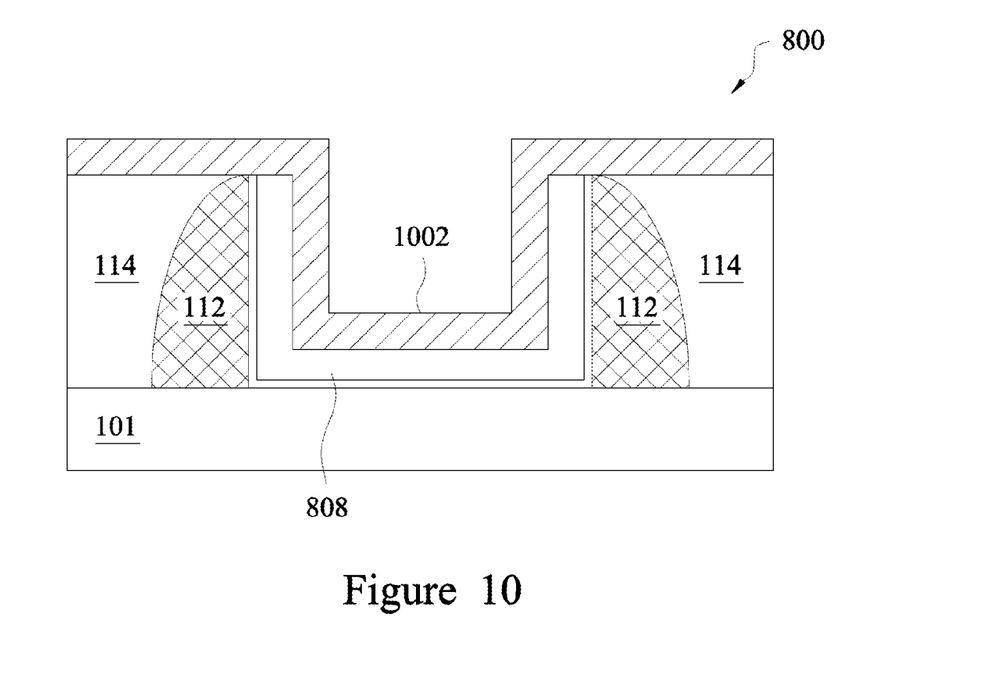

FIG. 10 illustrates a cross sectional view of the semiconductor device shown in FIG. 9 after a metal layer is deposited over the dielectric layer in accordance with various embodiments of the present disclosure. The metal layer 1002 may be formed on the dielectric layer 808 using suitable deposition techniques such as ALD, CVD, PVD and/or the like. The above deposition techniques are well known in the art, and hence are not discussed herein to avoid repetition.

In accordance with some embodiments, the metal layer 1002 is formed of suitable metal materials such as titanium nitride, tantalum nitride, tungsten nitride, titanium, tantalum, any combinations thereof and/or the like. In accordance with some embodiments, the metal layer 1002 may have a thickness of about 20 angstroms.

Figure 11:
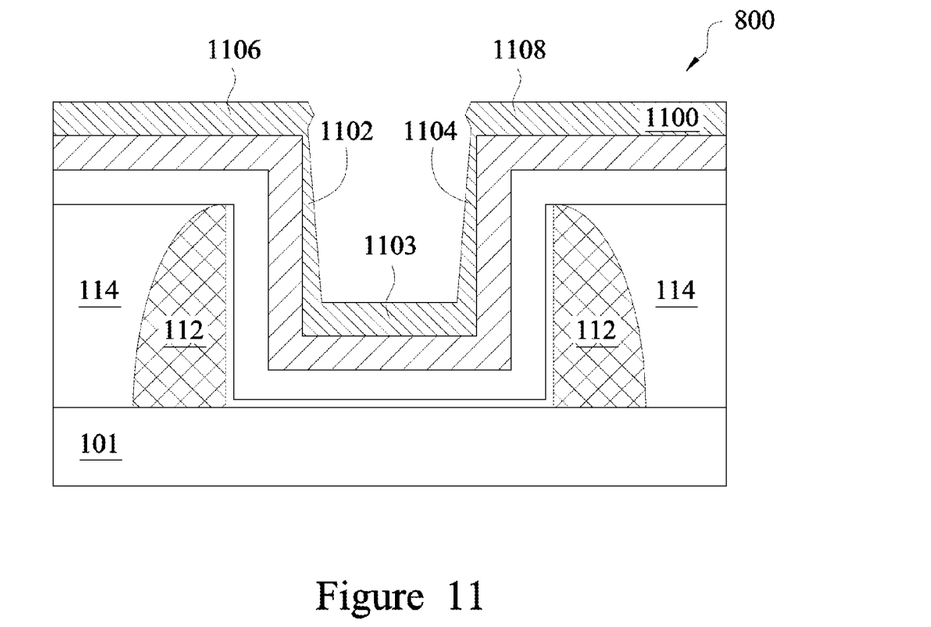

FIG. 11 illustrates a cross sectional view of the semiconductor device shown in FIG. 10 after a protection layer is deposited over the metal layer in accordance with various embodiments of the present disclosure. The protection layer 1100 is formed of dielectric materials such as silicon, silicon dioxide or the like. In some embodiments, the protection layer 1100 is formed on the metal layer 1002 using a high density plasma (HDP) based deposition process. In alternative embodiments, the protection layer 1100 is formed by a process including both a dielectric deposition process and an in-situ selective etching process. In particular, the dielectric deposition process may be a CVD process, an ALD process and/or the like. The in-situ selective etching process may be employed to partially remove the upper portions of the sidewalls of the protection layer so as to achieve a protection layer having a thinner upper sidewall as shown in FIG. 11.

As shown in FIG. 11, the protection layer 1100 may be further divided into five portions, namely a first top protection layer 1106, a second top protection layer 1108, a first sidewall protection layer 1102, a second sidewall protection layer 1104 and a bottom protection layer 1103. In accordance with some embodiments, the bottom protection layer 1103 may be of a thickness greater than 15 angstroms.

As shown in FIG. 11, both the first sidewall protection layer 1102 and the second sidewall protection layer 1104 may be of an uneven thickness. More particularly, the upper portion of the sidewall protection layer (e.g., first sidewall protection layer 1102) is thinner than the lower portion of the sidewall protection layer (e.g., first sidewall protection layer 1102). In other words, the sidewall protection layer (e.g., first sidewall protection layer 1102) becomes progressively thinner towards the upper portion of the sidewall protection layer (e.g., first sidewall protection layer 1102).

It should be noted that one advantageous feature of using the HDP based deposition process is an uneven sidewall protection layer can be created. In particular, the sidewall portion of the protection layer has a thinner upper portion as shown in FIG. 11.

It should further be noted that while FIG. 11 shows both the first sidewall protection layer 1102 and the second sidewall protection layer 1104 may be of the same shape, a person skilled in the art will recognize that it is within the scope and spirit of various embodiments for both sidewall protection layers to comprise different shapes.

Referring back to FIG. 3, the protection layer 310 is formed by a PVD process. The PVD process may cause a loading effect. More particularly, the protection layer 310 is thicker than the protection layer 1100, which is formed by a HDP based deposition process. A thicker protection layer may cause a large step region (e.g., corner step regions 826 and 828 shown in FIG. 8), which will be described below with respect to FIG. 13. Such a large step region may induce electrical performance degradation.

Figure 12:
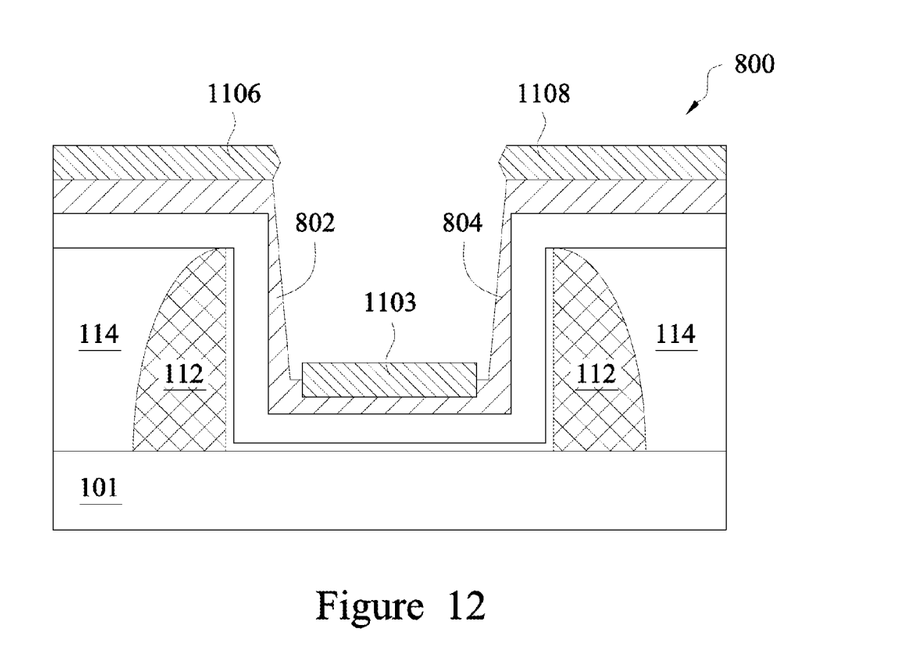

FIG. 12 illustrates a cross sectional view of the semiconductor device shown in FIG. 11 after an etching process is applied to the semiconductor device in accordance with various embodiments of the present disclosure. A suitable etching process such as wet-etching or dry-etching may be applied to the metal gate structure 800. The detailed operations of either the dry etching process or the wet etching process are well known, and hence are not discussed herein to avoid repetition.

In accordance with some embodiments, an isotropic etching process is employed to perform an etch-back. The protection layer 1100 (shown in FIG. 11) may be etched back during the isotropic etching process. Because each portion of the protection layer 1100 may have a different thickness and the isotropic etching etches equally in all directions, the thin portion such as the upper portions of the first sidewall protection layer 1102 and the second sidewall protection layer 1104 may be fully removed. As a result, both metal sidewalls are etched back subsequently, so that two thin upper portions of the metal sidewalls 802 and 804 are formed as shown in FIG. 12.

As shown in FIG. 12, the upper portions of the metal sidewalls 802 and 804 are thinner than those shown in FIG. 11. The upper portion of the metal sidewall is thinner than the lower portion of the metal sidewall. In other words, the first metal sidewall 802 becomes progressively thinner towards the upper portion of the first metal sidewall 802. Likewise, the second metal sidewall 804 becomes progressively thinner towards the upper portion of the second metal sidewall 804.

FIG. 12 further shows the bottom protection layer 1103 remains with a significant thickness after the etch-back process. Referring back to FIG. 11, the lower portions of the first sidewall protection layer 1102 and the second sidewall protection layer 1104 are thicker than the upper portions of the first sidewall protection layer 1102 and the second sidewall protection layer 1104. Therefore, the etchant may etch the upper portions of the metal sidewalls first. The remaining lower portions of the sidewalls 802 and 804 are thicker than their corresponding upper portions. The bottom protection layer 1103 helps to prevent the etching process from removing the bottom metal layer.

It should be noted that while FIG. 12 shows the remaining portion of the bottom protection layer 1103 is drawn with sharp lines, a person having ordinary skill in the art will recognize that the isotopic etching process may produce a remaining portion with various rounded edges.

Figure 13:
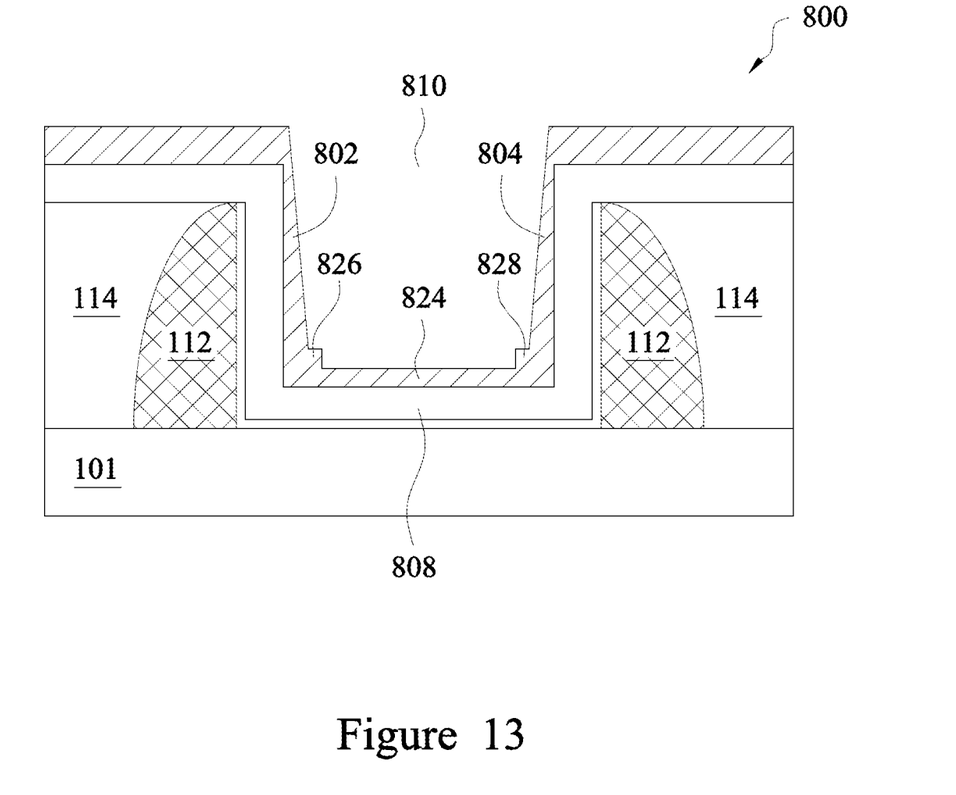

FIG. 13 illustrates a cross sectional view of the semiconductor device shown in FIG. 11 after the remaining bottom protection layer has been removed in accordance with various embodiments of the present disclosure. The remaining bottom protection layer 1103 (shown in FIG. 12) may be removed by a suitable removal process such as a dry etching, a wet etching process and/or the like. After removing the bottom protection layer, the metal gate structure 800 comprises the same metal gate structure as that shown in FIG. 8.

An advantageous feature of having the thinner upper portions of the metal sidewalls (e.g., the first metal sidewall 802) is the thinner upper portions allow extra space for a subsequent metal-fill process to fill the trench 810 of the metal gate structure 800. Furthermore, the thinner upper portions of the metal sidewalls help to reduce the loading effect of the metal gate structure 800. The reduced loading effect helps to achieve a thinner protection layer (shown in FIG. 11). The height of the corner step regions 826 and 828 is proportional to the thickness of the protection layer. The thinner protection layer helps to reduce the height of the corner step regions 826 and 828, thereby improving the electrical characteristics of the metal gate structure 800.

Figure 14:
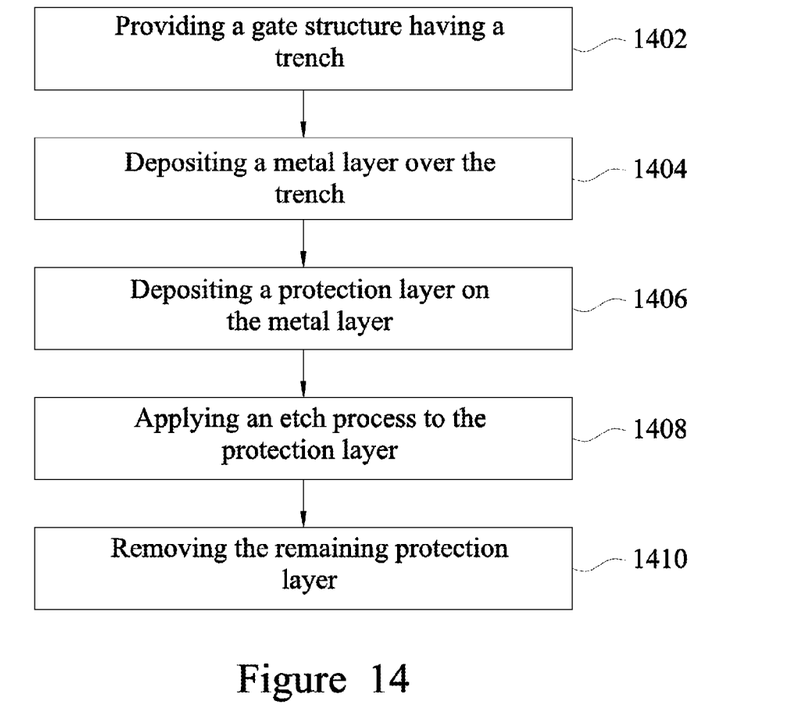
FIG. 14 illustrates a flow chart of a method for forming the semiconductor device shown in FIG. 8 in accordance with various embodiments of the present disclosure.

FIG. 14 illustrates a flow chart of a method for forming the semiconductor device shown in FIG. 8 in accordance with various embodiments of the present disclosure. This flowchart is merely an example, which should not unduly limit the scope of the claims. One of ordinary skill in the art would recognize many variations, alternatives, and modifications. For example, various step as illustrated in FIG. 14 may added, removed, replaced, rearranged and repeated.

At step 1402, a gate structure is provided. The gate structure comprises a trench formed in a dielectric layer over a substrate. At step 1404, a metal layer is deposited on the trench. The metal layer may be formed of metal nitride materials, metal carbide materials and/or the like.

At step 1406, a protection layer is deposited over the metal layer. The protection layer is formed of silicon and/or the like. The protection layer is formed by using a high density plasma (HDP) based deposition process. In alternative embodiments, the protection layer is formed by a process including both a dielectric deposition process and a selective etching process. The dielectric deposition process may be a CVD process, an ALD process and/or the like.

At step 1408, an etching process is applied to the protection layer. Because each portion of the protection layer may have a different thickness and the isotropic etching etches equally in all directions, the thin portion such as the upper portions of the sidewall protection layers may be fully removed. As a result, both metal sidewalls are etched back subsequently, so that two thinner metal sidewalls are formed. The metal sidewalls have an upper portion thinner than a lower portion. At step 1410, a removal process is applied to the remaining protection layer.

Figure 15:
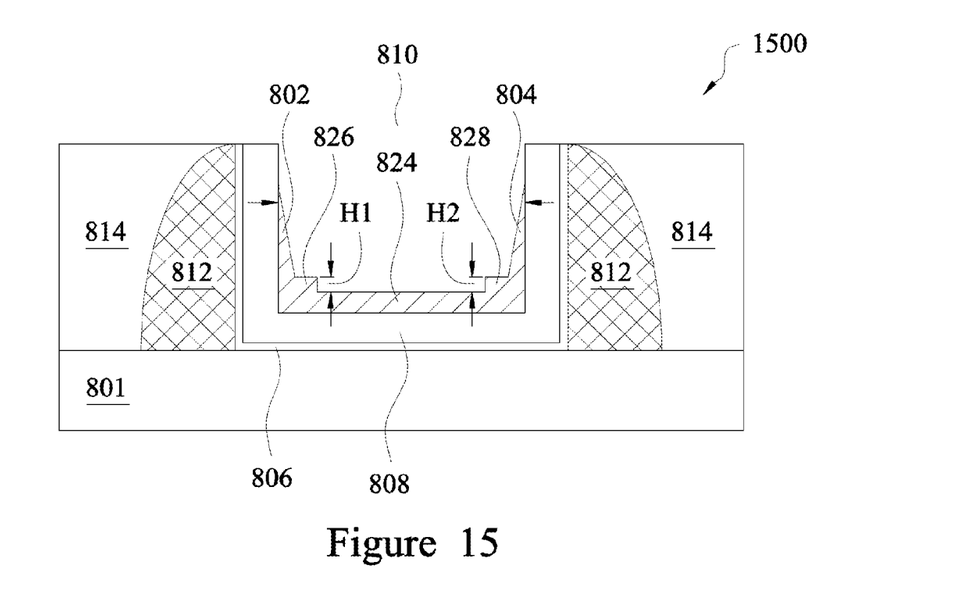
FIG. 15 illustrates a cross sectional view of yet another metal gate structure in accordance with various embodiments of the present disclosure.

FIG. 15 illustrates a cross sectional view of yet another metal gate structure in accordance with various embodiments of the present disclosure. The metal gate structure 1500 is similar to the metal gate structure 800 shown in FIG. 8 except that the shape of the metal sidewalls (e.g., metal sidewalls 802 and 804) is different.

As shown in FIG. 15, the dielectric layer 808 comprises a first dielectric sidewall and a second dielectric sidewall. The first metal sidewall 802 extends along the first sidewall of the dielectric layer 808. More particularly, the first metal sidewall 802 becomes progressively thinner and disappears at an upper portion of the first sidewall of the dielectric layer 808 as shown in FIG. 15. Likewise, the second metal sidewall 804 extends along the second sidewall of the dielectric layer 808 and the second metal sidewall 804 becomes progressively thinner and disappears at an upper portion of the second sidewall of the dielectric layer 808 as shown in FIG. 15.

Figure 16:
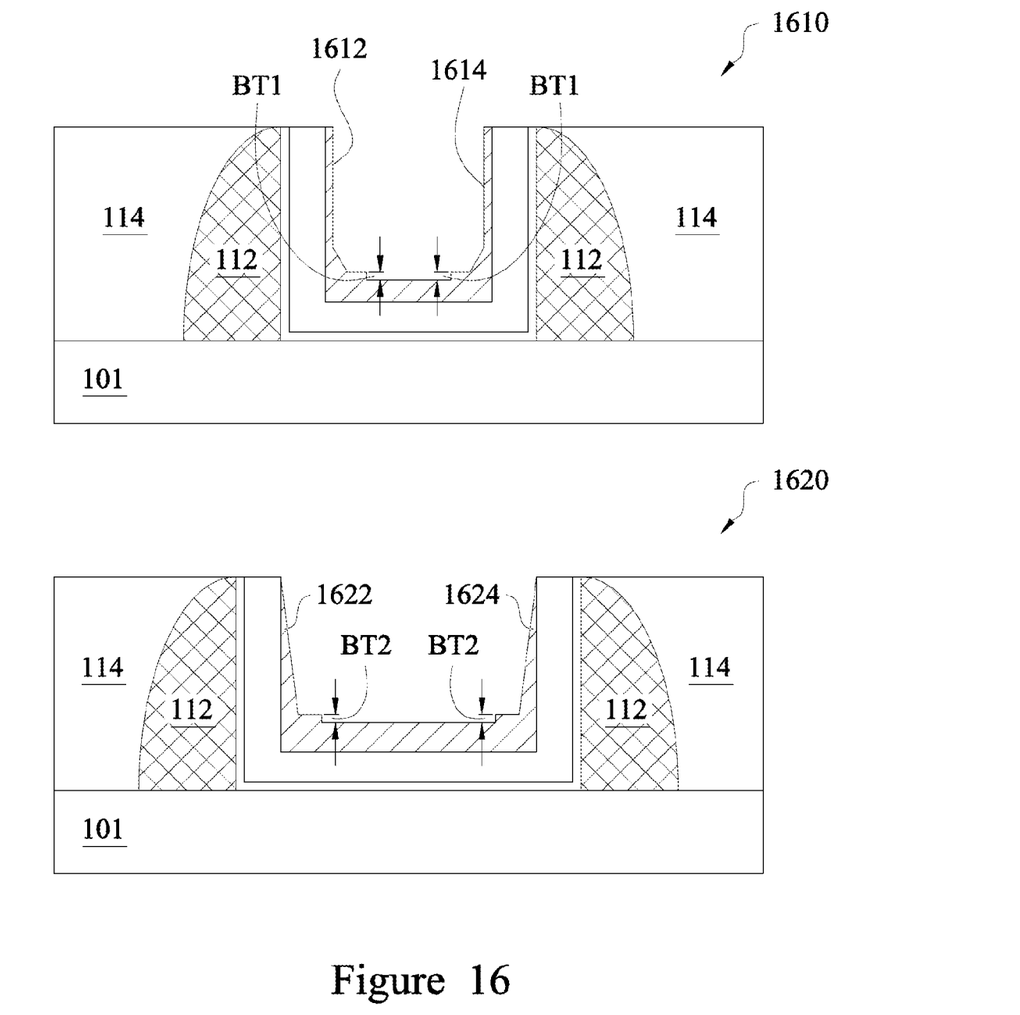
FIG. 16 illustrates the metal gate difference between a short channel MOS device and a long channel MOS device by employing the process described with respect to FIGS. 9-13.

FIG. 16 illustrates the metal gate difference between a short channel MOS device and a long channel MOS device by employing the process described with respect to FIGS. 9-13. As shown in FIG. 16, a short channel MOS device 1610 and a long channel MOS device 1620 may be of the same structure except that the channel length of the short channel MOS device 1610 is less than that of the long channel MOS device 1620. In accordance with an embodiment, the channel length of the short channel MOS device 1610 is less than about 30 nm. In contrast, the channel length of the long channel MOS device 1620 is greater than about 250 nm.

Despite that the same fabrication process may be employed, some physical parameters of metal layers may be different for short channel MOS devices and long channel MOS devices. As shown in FIG. 16, the metal sidewall of the short channel MOS device 1610 is of a uniform thickness. In contrast, the metal sidewall of the long channel MOS device 620 becomes progressively thinner towards an upper portion of the metal sidewall.

Furthermore, there are two corner step regions in each MOS device. The corner step regions in the short channel MOS device 1610 and the step region in the long channel MOS device 1620 may be of a height BT1 and BT2 respectively. In accordance with an embodiment, BT1 is of a height in a range from about 5 angstroms to about 35 angstroms. In contrast, BT2 is of a height in a range from about 5 angstroms to about 35 angstroms.

It should be noted that the difference between BT2 and BT1 shown in FIG. 16 is smaller than that shown in FIG. 6. In other words, the HDP based deposition process described above with respect to FIG. 11 helps to produce a thinner protection layer. Such a thinner protection layer is able to produce a small step region in both the long channel MOS device and the short channel MOS device. As a result, the electrical performance of both the long channel MOS device and the short channel MOS device is improved.

In accordance with an embodiment, a structure comprises a metal layer partially filling a trench of a metal gate structure, wherein the metal layer comprises a first metal sidewall, a second metal sidewall and a metal bottom layer between the first metal sidewall and the second metal sidewall, wherein an upper portion of the first metal sidewall is thinner than a lower portion of the first metal sidewall and an upper portion of the second metal sidewall is thinner than a lower portion of the second metal sidewall.

In accordance with an embodiment, a device comprises a metal gate structure in a trench and over a substrate, wherein the gate structure comprises a first metal sidewall in the trench, wherein the first metal sidewall becomes progressively thinner towards an upper portion of the first metal sidewall, a second metal sidewall in the trench, wherein the second metal sidewall becomes progressively thinner towards an upper portion of the second metal sidewall and a metal bottom layer on a bottom of the trench and between the first metal sidewall and the second metal sidewall.

In accordance with an embodiment, a method comprises depositing a dielectric layer on sidewalls and a bottom of a trench of a gate structure, depositing a metal layer on the dielectric layer, depositing a protection layer on the metal layer, wherein an upper portion of a sidewall portion of the protection layer is thinner than a lower portion of the sidewall portion of the protection layer and etching back the metal wherein an upper portion of a first metal sidewall of the metal layer is thinner than a lower portion of the first metal sidewall and an upper portion of a second metal sidewall of the metal layer is thinner than a lower portion of the second metal sidewall.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure comprising:
a metal layer partially filling a trench of a metal gate structure, wherein the metal layer comprises:
a first metal sidewall;
a second metal sidewall; and
a metal bottom layer between the first metal sidewall and the second metal sidewall, wherein:
an upper portion of the first metal sidewall is thinner than a lower portion of the first metal sidewall, wherein the upper portion and the lower portion of the first metal sidewall form a first slope region, and wherein the first slope region has a vertical sidewall and a non-vertical sidewall; and
an upper portion of the second metal sidewall is thinner than a lower portion of the second metal sidewall, wherein the upper portion and the lower portion of the second metal sidewall form a second slope region, and wherein the second slope region has a vertical sidewall and a non-vertical sidewall.

2. The structure of claim 1, further comprising:
a first dielectric layer under the metal layer;
a plurality of gate spacers surrounding the trench;
a barrier layer, wherein the barrier layer is formed between the first dielectric layer and the plurality of gate spacers; and
a second dielectric layer, wherein the second dielectric layer is formed adjacent to the plurality of gate spacers.

3. The structure of claim 1, further comprising:
a first step region between the first metal sidewall and the metal bottom layer; and
a second step region between the second metal sidewall and the metal bottom layer.

4. The structure of claim 3, wherein:
a first height of the first step region is in a range from about 5 angstroms to about 35 angstroms; and
a second height of the second step region is in a range from about 5 angstroms to about 35 angstroms.

5. The structure of claim 1, wherein:
the first metal sidewall becomes progressively thinner towards the upper portion of the first metal sidewall; and
the second metal sidewall becomes progressively thinner towards the upper portion of the second metal sidewall.

6. The structure of claim 1, wherein the metal layer comprises metal nitride.

7. A device comprising:
a metal gate structure in a trench and over a substrate, wherein the metal gate structure comprises:
a first metal sidewall in the trench, wherein the first metal sidewall becomes progressively thinner towards an upper portion of the first metal sidewall;
a second metal sidewall in the trench, wherein the second metal sidewall becomes progressively thinner towards an upper portion of the second metal sidewall; and
a metal bottom layer on a bottom of the trench and between the first metal sidewall and the second metal sidewall.

8. The device of claim 7, further comprising:
a first step region between the metal bottom layer and the first metal sidewall, wherein a first height of the first step region is in a range from about 5 angstroms to about 35 angstroms; and
a second step region between the metal bottom layer and the first metal sidewall, wherein a second height of the second step region is in a range from about 5 angstroms to about 35 angstroms.

9. The device of claim 7, wherein:
the metal bottom layer, the first metal sidewall and the second metal sidewall comprise metal nitride materials.

10. The device of claim 7, wherein:
an upper portion of the first metal sidewall is thinner than a lower portion of the first metal sidewall.

11. The device of claim 7, wherein:
an upper portion of the second metal sidewall is thinner than a lower portion of the second metal sidewall.

12. The device of claim 7, further comprising:
a dielectric layer on sidewalls and the bottom of the trench, wherein the dielectric layer comprises a first dielectric sidewall and a second dielectric sidewall.

13. The device of claim 12, wherein:
the first metal sidewall extends along the first dielectric sidewall of the dielectric layer and the first metal sidewall becomes progressively thinner and disappears at an upper portion of the first dielectric sidewall of the dielectric layer; and
the second metal sidewall extends along the second dielectric sidewall of the dielectric layer and the second metal sidewall becomes progressively thinner and disappears at an upper portion of the second dielectric sidewall of the dielectric layer.

14. A device comprising:
a dielectric layer on sidewalls and a bottom of a trench of a gate structure over a substrate; and
a metal layer on the dielectric layer, wherein:
an upper portion of a first metal sidewall of the metal layer is thinner than a lower portion of the first metal sidewall, wherein the upper portion and the lower portion of the first metal sidewall form a first slope region, and wherein the first slope region has a vertical sidewall and a non-vertical sidewall; and
an upper portion of a second metal sidewall of the metal layer is thinner than a lower portion of the second metal sidewall, wherein the upper portion and the lower portion of the second metal sidewall form a second slope region, and wherein the second slope region has a vertical sidewall and a non-vertical sidewall.

15. The device of claim 14, further comprising:
a bottom portion of the metal layer on the bottom of the trench;
a first step region over the bottom portion; and
a second step region over the bottom portion.

16. The device of claim 15, wherein:
the first step region is at a first corner of the trench; and
the second step region is at a second corner of the trench.

17. The device of claim 15, wherein:
the first step region is between the lower portion of the first metal sidewall and the bottom portion of the metal layer; and
the second step region is between the lower portion of the second metal sidewall and the bottom portion of the metal layer.

18. The device of claim 14, further comprising:
a barrier layer between the dielectric layer and the substrate.

19. The device of claim 14, wherein:
a top surface of the first metal sidewall is lower than a top surface of a sidewall of the dielectric layer; and
a top surface of the second metal sidewall is lower than a top surface of the sidewall of the dielectric layer.

20. The device of claim 19, wherein:
the top surface of the first metal sidewall is level with the top surface of the second metal sidewall.

* * * * *